US008756036B2

(12) United States Patent
Stolper

(10) Patent No.: US 8,756,036 B2
(45) Date of Patent: Jun. 17, 2014

(54) PARALLEL NAVIGATION IN A PLURALITY OF CAD MODELS

(75) Inventor: Thilo Stolper, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 179 days.

(21) Appl. No.: 13/055,661

(22) PCT Filed: Jul. 24, 2008

(86) PCT No.: PCT/EP2008/006088
§ 371 (c)(1),
(2), (4) Date: Jan. 24, 2011

(87) PCT Pub. No.: WO2010/009744
PCT Pub. Date: Jan. 28, 2010

(65) Prior Publication Data
US 2011/0131016 A1    Jun. 2, 2011

(51) Int. Cl.
*G06F 17/50* (2006.01)
(52) U.S. Cl.
USPC .......................................................... 703/1
(58) Field of Classification Search
USPC .................. 703/1, 2, 7, 8; 706/10; 712/1–43; 434/78–79
See application file for complete search history.

(56) References Cited

U.S. PATENT DOCUMENTS

| | | | |
|---|---|---|---|
| 6,828,963 B1* | 12/2004 | Rappoport | 345/419 |
| 6,985,835 B1* | 1/2006 | Etzion et al. | 703/1 |
| 7,761,266 B2* | 7/2010 | Mangon et al. | 703/2 |
| 2002/0029219 A1* | 3/2002 | Mulzer | 707/101 |
| 2005/0015169 A1* | 1/2005 | Littlejohn et al. | 700/108 |
| 2007/0091119 A1* | 4/2007 | Jezyk et al. | 345/619 |
| 2007/0174026 A1* | 7/2007 | Mangon et al. | 703/1 |
| 2008/0126023 A1* | 5/2008 | Hoguet | 703/1 |
| 2009/0148050 A1* | 6/2009 | Reghetti et al. | 382/219 |
| 2013/0124156 A1* | 5/2013 | Wolper et al. | 703/1 |

FOREIGN PATENT DOCUMENTS

| | | |
|---|---|---|
| CN | 101082988 | 12/2007 |
| CN | 101197045 | 6/2008 |
| EP | 1 233 376 | 8/2002 |

OTHER PUBLICATIONS

The Difference between two Feature Models, Matthijs Sypkens Smit and Willem F. Vronsvoort, Delft Univeristy of Technology, Computer-Aided Design & Applications, vol. 4, No. 6, 2007, pp. 843-851.*
Nemetschek Campus Allplan/Allplot FT V17; Book; 2002; DE.
Anfragebearbeitung in föderierten räumichen Datenbanksystemen; Book; 2006; DE.

* cited by examiner

*Primary Examiner* — Matt Kim
*Assistant Examiner* — Maryam Ipakchi
(74) *Attorney, Agent, or Firm* — Cozen O'Connor

(57) ABSTRACT

A method for representing a plurality of computer aided design (CAD) models, wherein objects are compared between the CAD models, objects that match between the CAD models are selected, and the CAD models are aligned uniformly using the selected objects.

10 Claims, 2 Drawing Sheets

PARALLEL NAVIGATION IN A PLURALITY OF CAD MODELS

CROSS-REFERENCE TO RELATED APPLICATIONS

This is a U.S. national stage of International Application No. PCT/EP2008/006088, filed on 24 Jul. 2008.

BACKGROUND OF THE INVENTION

1. Field of the Invention

The invention relates to computer aided design and, more particularly, to a method for presenting at least two Computer Aided Design (CAD) models.

2. Description of the Related Art

Computer Aided Design (CAD) models have a large volume of detailed information about installations, such as production plants in the production industry or other graphically representable objects. Complex systems, such as production plants, are usually planned by a large number of successive versions of CAD models. In this context, it may also arise that the CAD models do not involve successive versions but, on the contrary, different CAD systems are used to be able to present different circumstances. In addition, parallel workflows may arise, so that there are different versions of CAD models for the production plant or for other objects which can be represented by CAD models. Furthermore, it is an occurrence that a CAD model has been transformed from one format to another, for example, the company that produces an installation model sometimes uses a different CAD version or a different format than the installation constructor.

In all of these situations, the different versions of the CAD models need to be compared with one another and checked for discrepancies to ensure that the data used in the CAD models match. Given the complexity of the CAD models, this is an involved matter. Generally, the various known models which are available need to be compared and considered by the user by hand. To this end, the models, insofar as they are available, need to be adjusted manually in respect of the viewing angle for individual objects and the distance of individual objects. This is a difficult undertaking.

SUMMARY OF THE INVENTION

It is therefore an object of the present invention to provide a method for parallel presentation of CAD models in which a uniform viewing angle for the objects of the CAD models is ensured.

This and other objects and advantages are achieved in accordance with the invention by a method for presenting at least two CAD models, in which objects are compared between the CAD models, objects which match between the CAD models are selected and the CAD models are oriented uniformly using the selected objects.

The invention is based on the insight that the individual objects, which form parts of the CAD models and which represent installation equipment or particular components of a system, for example, are created in the CAD models in a coordinate system. If the various CAD models describe the same installation or the same system, there are matching objects between them. These matching objects are taken as a basis for using the position thereof in the respective coordinate system to achieve a uniform orientation for the CAD models. This allows different versions of CAD models to be presented uniformly or in parallel. A user can therefore be shown a plurality of different versions of CAD models on a screen, and the viewing direction which the user has for the models is the same because they can be oriented uniformly using the selected objects, which occur in all the CAD models presented. As a result, it is easier for a user to consider and compare the installations and systems presented in the different CAD models or the different versions of the CAD models. It is therefore possible for one screen to be used to display a plurality of CAD models simultaneously and in sync, where the views are calculated from the matching objects that occur in all the CAD models and from the positions of the objects in their respective CAD models.

In a further advantageous embodiment of the invention, the objects are selected automatically by an engineering system, where the engineering system performs the object comparison. Here, the engineering system accesses the objects of the individual CAD models, and a check is performed to determine which objects occur in the different versions or formats of the CAD models. Those objects which occur in all the CAD models which are to be considered are selected. In this context, the objects can be checked using their name, and the objects can be selected and qualified in this way. Here, the advantage is that a user of the method does not independently need to look for objects which occur in the different CAD models. This is particularly advantageous if an entire set of changes has been made between the versions and there are only relatively few matching objects, which are then difficult for the user to find.

In a further advantageous embodiment of the invention, the objects are selected by a user. If the engineering system is unable, on the basis of the available information, to find matching objects between the CAD models which are to be presented, it is still possible for the user to check the different CAD models individually for matching objects between the models. He can then select these matching objects and take them as a basis for the parallel orientation of the CAD models. Here, the advantage is that the user is still able to take action in the system when the engineering system is unable to find matching objects. The user is therefore less dependent on the engineering system.

In a further advantageous embodiment of the invention, the CAD models are oriented using the positions of the selected matching objects in the coordinate system of a master CAD model. Among the various CAD models to be displayed, one is therefore selected which determines the presentation of the other CAD models which are to be displayed. A CAD model therefore forms the master for the user, and the presentation of the other CAD models then follows the orientation of the objects of the master CAD model. Here, it is advantageous that it is distinctly clear to the user in which CAD model he is navigating and which CAD models are following his navigation.

In yet a further advantageous embodiment, three matching objects are selected. Based on the three matching objects, the presentation of the CAD model can be indicated explicitly. The three objects each have an explicit position in a three-dimensional coordinate system and they themselves again form three points in the three-dimensional coordinate system which are able to be taken as a basis for explicitly determining a viewing direction for the objects or a viewing angle. Here, the three selected objects can be taken as a basis for explicitly stipulating the way in which the CAD model is situated in three-dimensional space. The three selected objects are also called key objects. An advantage in this context is that only three objects which match need to be selected between the different CAD models in order to allow comparison or parallel presentation of the various CAD models.

In a further advantageous embodiment of the invention, the CAD model which is used as the master for the orientation of the CAD models is selected by a user. As a result, the user is provided with the opportunity to select one of the CAD models which are to be displayed as his master model and to take the selected CAD model as a basis for the comparison thereof with the other CAD models or as a basis for the continued work. The user is therefore as flexible as possible in his decision regarding which of the CAD models he would like to take as a basis for the navigation in the overall system.

In still a further advantageous embodiment of the invention, the CAD models are presented in a uniform size, where depth information about the objects in the three dimensional coordinate system is used for the presentation. The CAD models are therefore presented uniformly or in parallel not only in respect of the situation thereof in space, i.e., in respect of the viewing direction of the observer but, rather, there is also uniform presentation in respect of the size of the objects. Consequently, the distance of the objects from the observer or from the control point on the surface of the display is uniform. This is achieved by using the depth information from the graphics card which is available in a z-buffer. The advantage for the user in this context is that the different CAD models, insofar as they match, can also be displayed identically on the screen surface.

In another advantageous embodiment of the invention, the navigation in the CAD models is effected in parallel, where the navigation is effected by transforming the coordinate information from the selected objects of the master CAD model to the selected objects of the CAD models which are to be presented. Here, it is advantageous for the user that the CAD models to be presented all exhibit the same behavior when the user is navigating in the master CAD model. By way of example, the navigation is effected using a mouse or mouse pad and the user can change the viewing angle and distance from the objects in his master CAD model. When he does this, the available coordinate information for the individual objects, i.e., the selected key objects, are immediately transferred from the master CAD model to the other CAD models and the navigation can therefore be effected uniformly in all the models. Consequently, the viewing angle and distance from the objects do not only change in the master CAD model, but on the contrary the same change is simultaneously made in the further CAD models presented on the display. Hence, all the models behave in the same way and the user can take the same navigation path through the different models at the same time.

In an additional advantageous embodiment of the invention, differences in the objects between the CAD models are marked. The CAD models are compared with one another by the engineering system and differences which the engineering system finds between the objects can be visually displayed in the various CAD models. This can be achieved by color marking, shading or semi-transparent representation, for example. An advantage in this case is that the user immediately recognizes the differences between the various models and said differences can also be presented when navigating through the CAD models.

In a further advantageous embodiment of the invention, resources are allocated to the objects by a resource project model. The entire system is based on a resource project model which allows the individual objects in the CAD models to be allocated genuine installation resources or components of the complex system which is represented by the CAD models. Hence, each object in the CAD models has an associated genuine resource or piece of equipment.

Overall, the system is very advantageous because it can be used to compare different work states, for example. Here, it is possible to compare not only different versions but also different formats of CAD models. The user of the CAD models is provided with a simple opportunity to easily achieve a uniform view of the different models in parallel and at the same time to allow the differences which are present in the models to be presented.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is described and explained in more detail below with reference to the drawings, in which.

DETAILED DESCRIPTION OF THE PREFERRED EMBODIMENTS

Figure 1:
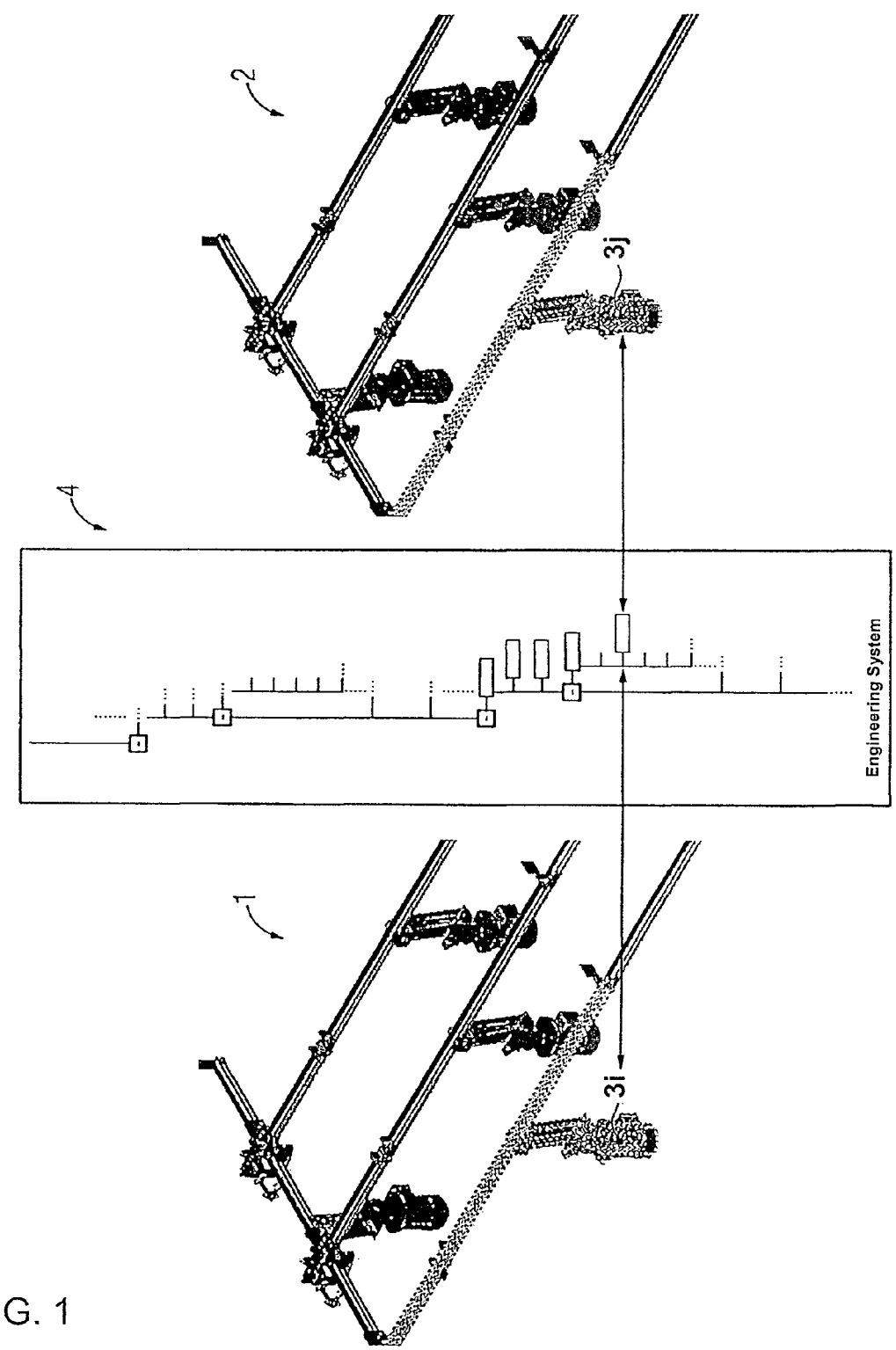
FIG. 1 is a schematic block diagram of CAD objects.

FIG. 1 shows two CAD models 1, 2 which can represent different versions of an installation model and which can also represent different formats of a CAD model of an installation. Here, the CAD models have objects 3i, 3j that represent the genuine installation parts or resources or the installation equipment in the system. In this context, there are objects which are different, for example, because they have been changed in one version or because they have been changed upon conversion from one CAD format to another CAD format between the different CAD models. However, there are also objects which match between the two CAD systems shown in the exemplary embodiment. These objects 3i, 3j are selected and used as a basis for the uniform parallel presentation of the CAD models. Besides the two CAD models shown in FIG. 1, it is also possible for further CAD models to be added. In this case, it is then likewise checked whether matching objects exist between all the CAD models involved. The matching objects are selected and consequently become what are known as key objects. On the basis of these key objects, parallel presentation of the CAD models is then achieved. This is done by taking the position information associated with the objects as a basis in the respective coordinate system of the CAD model. The matching objects have a matching situation in the model, and it is therefore possible for the different models to be oriented using the matching objects. This is done in respect of the viewing angle for the CAD models and also in relation to the distance at which the objects are presented.

An engineering system 4 can be used to automatically select the matching objects 3i, 3j. To this end, the engineering system stores a resource project model for the installation. The individual resources have the respective objects associated with them in the CAD models. Consequently, the engineering system can now use its resource object model to check whether there are matching objects in the various CAD models. If the engineering system finds matching objects in the various CAD models, they are defined as key objects and are used for the uniform or parallel orientation of the various CAD models which are to be presented. These are then presented using the coordinate information of the key objects from the same perspective for the user. The system is navigated by virtue of the user interacting with one of the CAD models, i.e., the master CAD model. It is the respective CAD model in the window which contains the computer mouse or the mouse pointer (not shown). It is therefore possible for the user to change from one CAD model to the other CAD model as the master model.

Here, the differences or differing image segments between the CAD models are visually displayed to the user, such as by color marking. If one CAD model is moved by the user, the other CAD models are repositioned and the user sees all the models from the same perspective and the same distance. The distance of the individual objects is calculated by the depth values in a Z buffer of a graphics card of a display monitor. Overall, the method therefore ensures that the user can easily navigate through the CAD models and the differences between the CAD models are presented clearly.

Figure 2:
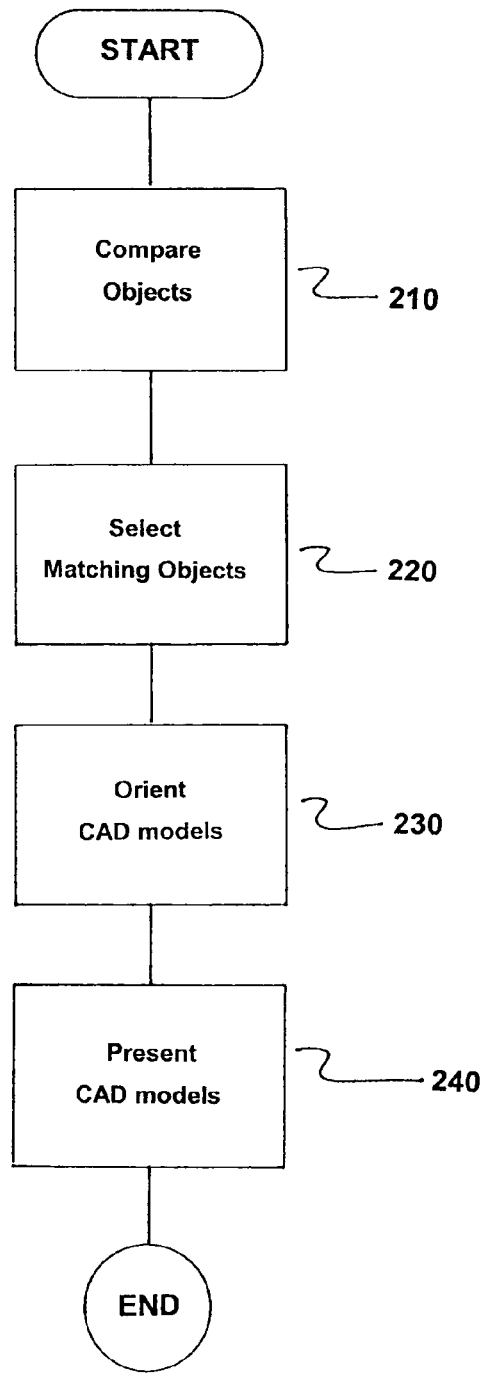
FIG. 2 is a flow chart of the method in accordance with the invention.

FIG. 2 is a flow chart of a method for presenting a plurality of computer aided design models. The method comprises comparing, in an engineering system, objects between the CAD models, as indicated in step 210. Objects that match between the CAD models are selected, as indicated in step 220. A plurality of CAD models uniformly using the selected objects which match between the CAD models are oriented, as indicated in step 230. The uniformly oriented plurality of CAD models are then presented, as indicated in step 240.

Thus, while there are shown, described and pointed out fundamental novel features of the invention as applied to preferred embodiments thereof, it will be understood that various omissions and substitutions and changes in the form and details of the illustrated apparatus, and in its operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice.

The invention claimed is:

1. A method for presenting a plurality of computer aided design models, comprising:
    comparing, objects between each of the plurality of CAD models, each of the plurality of objects representing one of different versions of an installation model and different formats of a CAD model of an installation;
    selecting objects which match between each of the plurality of CAD models;
    orienting the plurality of CAD models uniformly using the selected objects which match between each of the plurality of CAD models; and
    presenting the uniformly oriented plurality of CAD models.

2. The method as claimed in claim 1, wherein the objects are selected automatically by an engineering system, and wherein the engineering system performs the object comparison.

3. The method as claimed in claim 1, wherein the objects are selected by a user.

4. The method as claimed in claim 1, wherein the plurality of CAD models are oriented using positions of the selected objects in a coordinate system of a master CAD model.

5. The method as claimed in claim 4, wherein the CAD model used as the master CAD model for orienting the plurality of CAD models is selected by a user.

6. The method as claimed in claim 4, wherein navigation in the plurality of CAD models is effected in parallel, and wherein the navigation is effected by transforming coordinate information from the selected objects of the master CAD model to selected objects of other CAD models which are to be presented.

7. The method as claimed in claim 1, wherein three matching objects are selected.

8. The method as claimed in claim 1, wherein the plurality of CAD models are presented in a uniform size, and wherein depth information about the plurality of objects in a three-dimensional coordinate system is used for presenting the plurality of CAD models.

9. The method as claimed in claim 1, wherein differences in the objects between the plurality of CAD models are marked.

10. The method as claimed in claim 1, wherein resources are allocated to the objects by a resource project model.

* * * * *